(12) United States Patent
Hirabayashi

(10) Patent No.: US 6,999,338 B1
(45) Date of Patent: Feb. 14, 2006

(54) SEMICONDUCTOR STORAGE DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/013,429

(22) Filed: Dec. 17, 2004

(30) Foreign Application Priority Data

Aug. 31, 2004 (JP) ............................ 2004-253221

(51) Int. Cl.
*G11C 7/00* (2006.01)
(52) U.S. Cl. ................................. 365/154; 365/189.09
(58) Field of Classification Search ............... 365/154, 365/189.09, 189.11, 229
See application file for complete search history.

(56) References Cited

U.S. PATENT DOCUMENTS

| | | | |
|---|---|---|---|
| 5,303,190 A | * | 4/1994 | Pelley, III ............... 365/189.11 |
| 5,659,513 A | * | 8/1997 | Hirose et al. ............... 365/205 |
| 5,726,944 A | * | 3/1998 | Pelley et al. ................ 365/226 |

OTHER PUBLICATIONS

Masanao Yamaoka, et al., "A 300MH$_z$ 25μA/Mb Leakage On-Chip SRAM Module Featuring Process-Variation Immunity and Low-Leakage-Active Mode for Mobile-Phone Application Processor", 2004 IEEE International Solid-State Circuits Conference, ISSCC 2004, Session 27/SRAM/27.2, 10 Pages.

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor storage device includes first and second additional FETs disposed in parallel on one of potential lines for supplying first and second drive potentials to each SRAM memory cell. When each memory cell is selected, a selection signal is supplied to the gate terminal of the first additional FET through a selection signal supply line to turn on the first additional FET. A bias generation circuit is configured to generate a bias potential and supply it to the gate terminal of the second additional FET. The bias potential is generated to reflect one or both of fluctuations in the potential difference between the first and second drive potentials, and variations in the threshold voltage of FETs included in the cross-feedback circuit of each memory cell.

24 Claims, 7 Drawing Sheets

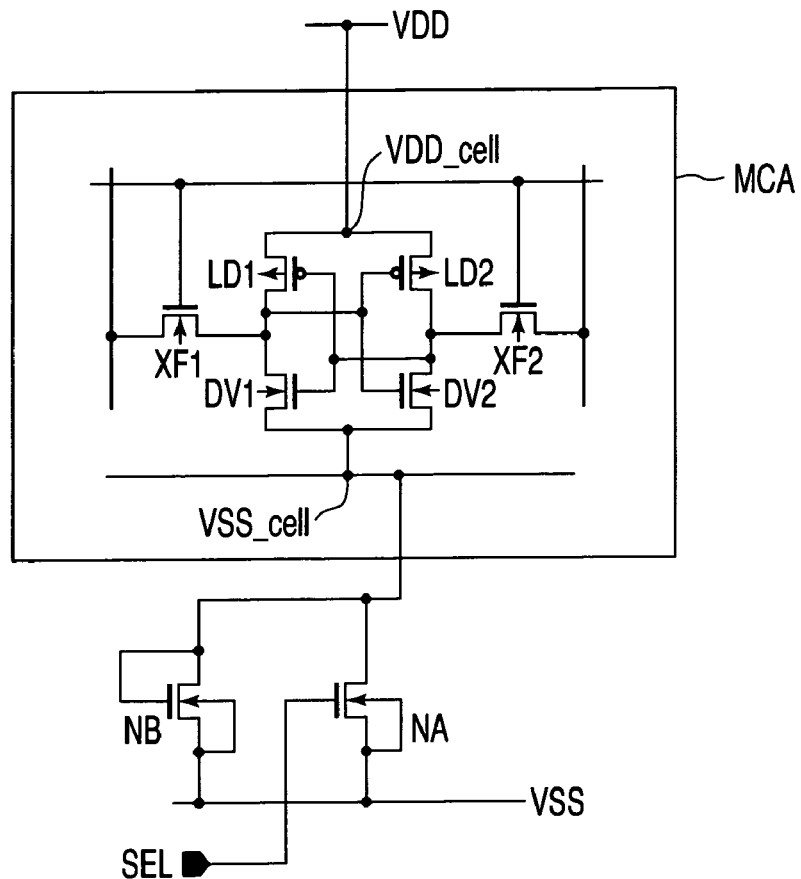
F I G. 1
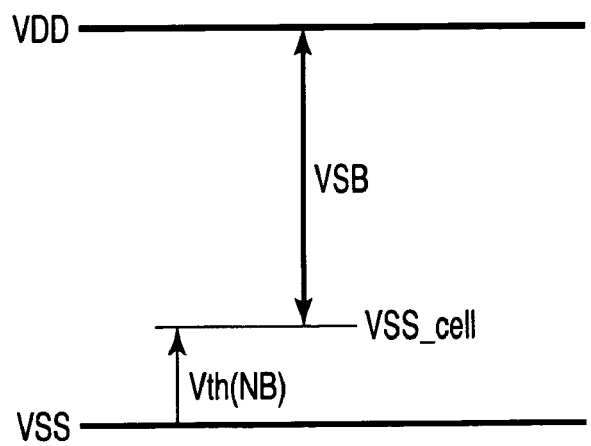
F I G. 2

SEMICONDUCTOR STORAGE DEVICE

CROSS-REFERENCE TO RELATED APPLICATIONS

This application is based upon and claims the benefit of priority from the prior Japanese Patent Application No. 2004-253221, Aug. 31, 2004, the entire contents of which are incorporated herein by reference.

BACKGROUND OF THE INVENTION

1. Field of the Invention

The present invention relates to a semiconductor storage device, and particularly to a technique for reducing standby current in a static semiconductor storage device, e.g., an SRAM (SRAM: Static Random Access Memory).

2. Description of the Related Art

SRAMs (typically, each memory cell includes six transistors to store one bit) are widely used for LSIs (LSI: Large Scale Integrated circuit). A problem has become prominent in that leakage current increases in memory cells on standby, as a consequence of the reduced size and operation voltage of LSIs. The term "standby" means that a memory cell is in the non-selected state.

The thickness of the gate oxide film of MOSFETs (MOSFET: Metal-Oxide-Semiconductor Field-Effect Transistor) used in SRAMs decreases, as LSIs are more miniaturized and more highly integrated. As a consequence, leakage current tunneling through the gate oxide film (gate leakage) increases and thereby brings about an increase in the entire leakage current on standby. In addition, the threshold voltage of MOSFETs decreases with decrease in the operation voltage of LSIs, which brings about an increase in the leakage current in the OFF-state (sub-threshold leakage).

As a countermeasure for reducing standby leakage in SRAMs, there is a method of controlling the electric potential of a cell array on standby to relax an electric field applied to MOSFETs, in view of circuitry (for example, Masanao Yamada et al., "A 300 MHz 25 µA/Mb Leakage On-Chip SRAM Module . . . ", ISSCC 2004/SESSION 27/SRAM/27.2, pp. 494–495).

BRIEF SUMMARY OF THE INVENTION

According to a first aspect of the present invention, there is provided a semiconductor storage device comprising: a memory cell array including a plurality of SRAM memory cells (SRAM: Static Random Access Memory) arrayed therein; a plurality of word lines configured to select the memory cells; a plurality of complementary pairs of data lines configured to transmit data into and from the memory cells; a first potential line configured to supply a first drive potential to each of the memory cells; a second potential line configured to supply a second drive potential lower than the first drive potential to each of the memory cells; a first additional FET (FET: Field-Effect Transistor) disposed on one potential line of the first and second potential lines, to selectively bring the one potential line into conduction; a selection signal supply line configured to supply a selection signal to a gate terminal of the first additional FET, so as to set the first additional FET in an ON-state, when each of the memory cells is selected; a second additional FET disposed on the one potential line, in parallel with the first additional FET, to selectively bring the one potential line into conduction; and a bias generation circuit configured to generate a bias potential and supply the bias potential to a gate terminal of the second additional FET, wherein the bias potential is generated to reflect one or both of fluctuations in a potential difference between the first and second drive potentials, and variations in threshold voltage of FETs included in a cross-feedback circuit of each of the memory cells.

According to a second aspect of the present invention, there is provided a semiconductor storage device comprising: a memory cell array including a plurality of memory cells arrayed therein, each of the memory cells having first to fourth NMISFETs (MIS: Metal-Insulator-Semiconductor) and first and second PMISFETs, such that a drain terminal of the first NMISFET is connected to a drain terminal of the first PMISFET, a drain terminal of the second NMISFET is connected to a drain terminal of the second PMISFET, gate terminals of the first NMISFET and the first PMISFET are connected to the drain terminals of the second NMISFET and the second PMISFET and a source terminal of the third NMISFET, and gate terminals of the second NMISFET and the second PMISFET are connected to the drain terminals of the first NMISFET and the first PMISFET and a source terminal of the fourth NMISFET; a plurality of word lines configured to select the memory cells, each of the word lines being connected to gate terminals of the third NMISFET and the fourth NMISFET; a plurality of complementary pairs of data lines configured to transmit data into and from the memory cells, the data lines of each of the complementary pairs being connected to drain terminals of the third NMISFET and the fourth NMISFET, respectively; a first potential line connecting source terminals of the first PMISFET and the second PMISFET to a supply source of a first drive potential; a second potential line connecting source terminals of the first NMISFET and the second NMISFET to a supply source of a second drive potential lower than the first drive potential; a fifth NMISFET disposed on the second potential line to selectively bring the second potential line into conduction; a selection signal supply line configured to supply a selection signal to a gate terminal of the fifth NMISFET, so as to set the fifth NMISFET in an ON-state, when each of the memory cells is selected; a third PMISFET disposed on the second potential line, in parallel with the fifth NMISFET, to selectively bring the second potential line into conduction; and a first bias generation circuit configured to generate a first bias potential and supply the first bias potential to a gate terminal of the third PMISFET, the first bias generation circuit comprising a first path supplied with the first and second drive potentials respectively at opposite ends, and configured to output the first bias potential from a first node on the first path.

BRIEF DESCRIPTION OF THE SEVERAL VIEWS OF THE DRAWING

FIG. 1 is a view showing a conventional countermeasure in view of circuitry for reducing standby leakage in an SRAM;

FIG. 2 is a view showing the potential relationship within a memory cell on standby in the device shown in FIG. 1;

DETAILED DESCRIPTION OF THE INVENTION

Figure 3:
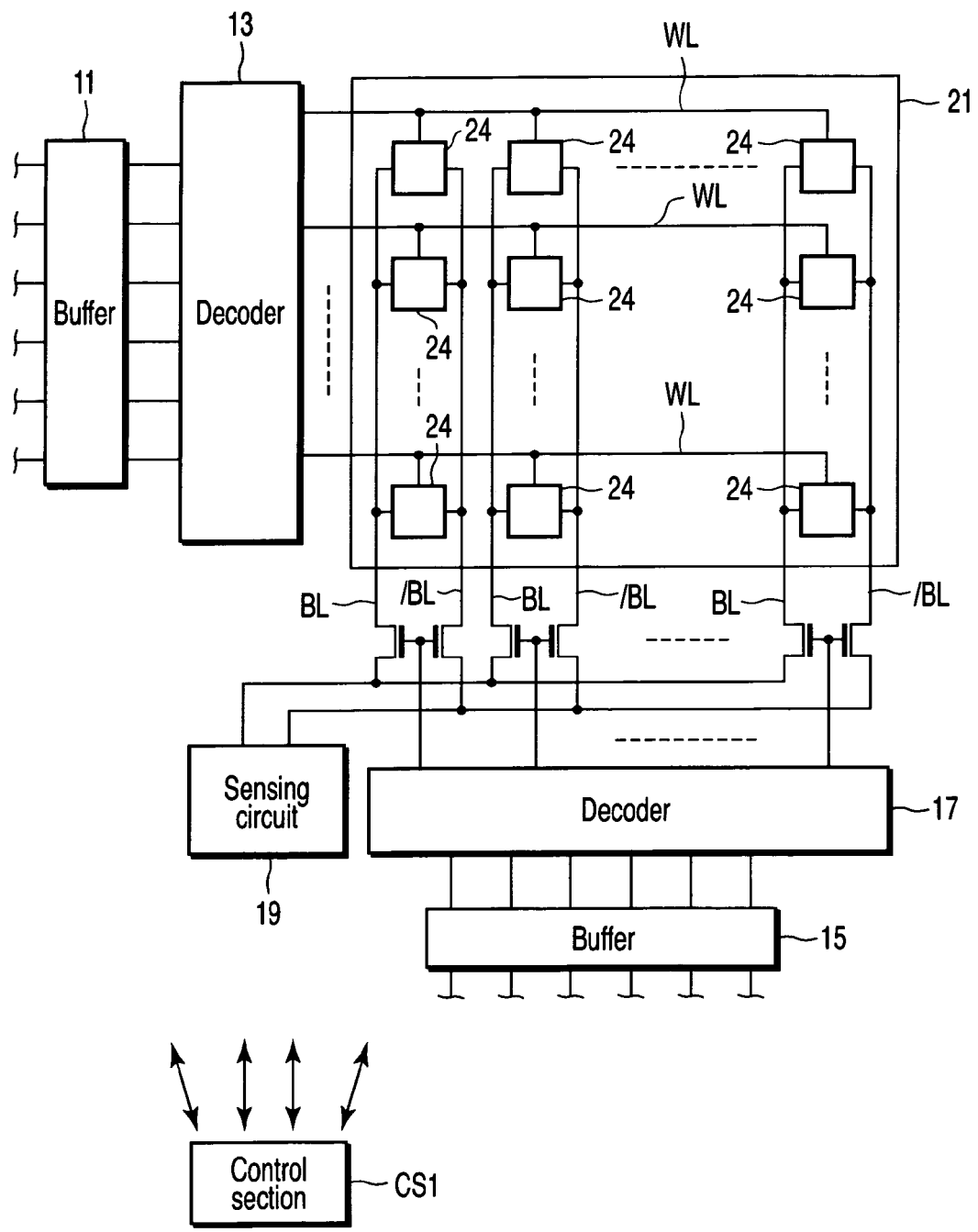
FIG. 3 is a block diagram showing an SRAM (semiconductor storage device) according to a first embodiment of the present invention.

In the process of developing the present invention, the inventors studied conventional countermeasures in view of circuitry for reducing standby leakage in SRAMs. As a result, the inventors have arrived at the findings given below.

FIG. 1 is a view showing a conventional countermeasure in view of circuitry for reducing standby leakage in an SRAM. The SRAM includes a memory cell array MCA, in which a plurality of memory cells are arrayed in a matrix format. However, FIG. 1 shows only one memory cell in an enlarged view, for the sake of convenience.

As shown in FIG. 1, each memory cell includes six transistors, i.e., two driver transistors DV1 and DV2, two load transistors LD1 and LD2, and two transfer gate transistors XF1 and XF2. The transistors DV1, DV2, XF1, and XF2 are formed of N- (N-channel type) MOSFETs, while the transistors LD1 and LD2 are formed of P- (P-channel type) MOSFETs. The driver transistors DV1 and DV2 and load transistors LD1 and LD2 are connected to form a cross-feedback circuit.

When the memory cell is selected, the source potential (higher potential) VDD_cell of the transistors LD1 and LD2, and the source potential (lower potential) VSS_cell of the transistors DV1 and DV2 are set to be a power supply potential VDD and a ground potential VSS, respectively. In the case of an ordinary SRAM provided with no countermeasure in view of circuitry for reducing standby leakage, the potential VDD_cell and potential VSS_cell are maintained at the power supply potential VDD and ground potential VSS, respectively, even when it is on standby. However, in the case of the device shown in FIG. 1, the level of the lower potential VSS_cell (or it may be the level of the higher potential VDD_cell) is controlled to reduce the standby leakage, when it is on standby.

More specifically, a potential line connecting a node on the lower potential VSS_cell side to a VSS potential source is provided with first and second additional transistors (NMOSFETs) NA and NB disposed thereon in parallel for selectively bringing the line into conduction. One additional transistor NA is supplied with a selection signal on its gate terminal, such that it is set in the ON-state when the memory cell is selected, and it is set in the OFF-state when the memory cell is non-selected. The other additional transistor NB is configured in a diode-connection state in which its gate terminal and drain terminal are connected to each other. The transistor NB is turned on by a voltage drop generated in the memory cell when the transistor NA is set in the OFF-state.

FIG. 2 is a view showing the potential relationship within a memory cell on standby in the device shown in FIG. 1. When the memory cell is selected, the ground potential VSS is applied to the node on the lower potential VSS_cell side, through the transistor NA set in the ON-state. On the other hand, when the memory cell is non-selected and the transistor NA is set in the OFF-state, the level of the lower potential VSS_cell gradually increases from the ground potential VSS due to leakage, as shown in FIG. 2. When the lower potential VSS_cell increases to the threshold voltage Vth(NB) of the transistor NB, the transistor NB is turned on.

As a consequence, the level of the lower potential VSS_cell is clamped by the threshold voltage Vth(NB). Accordingly, the voltage (standby voltage VSB) applied to the memory cell on standby is clamped at a value expressed by the following formula (1).

$$VSB = VDD - VSS - Vth(NB) \tag{1}$$

Furthermore, as expressed by the following formula (2), the standby voltage may be further relaxed by increasing the number M of second additional transistors NB connected in series.

$$VSB = VDD - VSS - Vth(NB) \times M \tag{2}$$

As described above, the potential line connecting the node on the lower potential VSS_cell side to the VSS potential source is provided with the MOSFET disposed thereon and configured in a diode-connection state, so that the standby voltage VSB is easily relaxed. However, according to this countermeasure, the protection circuit (additional transistor NB) requires a sufficient margin to absorb fluctuations in the power supply potential VDD, variations (mainly process errors) in the threshold voltage Vth of the memory cell transistors, and so forth, in order to prevent retention data from being destroyed.

More specifically, for example, where the power supply potential VDD fluctuates within ±10%, leakage becomes maximum when the potential increases to [VDD+10%]. However, it is necessary for the standby voltage to sufficiently retain cell data, even when the potential decreases to [VDD−10%]. If the number M of second additional transistors NB connected in series is set based only on [VDD+10%], a voltage drop generated in the memory cell at [VDD−10%] becomes too large, thereby likely destroying cell data.

As described above, the countermeasure shown in FIG. 1 needs to ensure a sufficient margin for fluctuations in the VDD, variations in the threshold voltage Vth of transistors, and so forth. For this reason, the countermeasure shown in FIG. 1 has a problem in that the reduction in the standby voltage is insufficient.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

FIG. 3 is a block diagram showing an SRAM (semiconductor storage device) according to a first embodiment of the present invention. The SRAM includes a memory cell array 21, in which memory cells 24 are respectively disposed at addresses arrayed in a matrix format. Word lines WL for selecting the memory cells are respectively connected to the rows of the memory cell array 21. Complementary pairs of data lines BL and /BL for transmitting data to and from the memory cells are respectively connected to the columns of the memory cell array 21.

A row address buffer 11 and a row decoder 13 are disposed to select the word lines WL. A column address buffer 15 and a column decoder 17 are disposed to select the data lines BL and /BL. A sensing circuit 19 is connected to the data lines BL and /BL, for reading stored data. The row address buffer 11 and column address buffer 12 are connected to a control section CS1 for generating address signals, data signals, and so forth. The control section CS1 is disposed on a substrate common to the memory cell array 21, or is formed as a device separate from the memory cell array 21.

Figure 4:
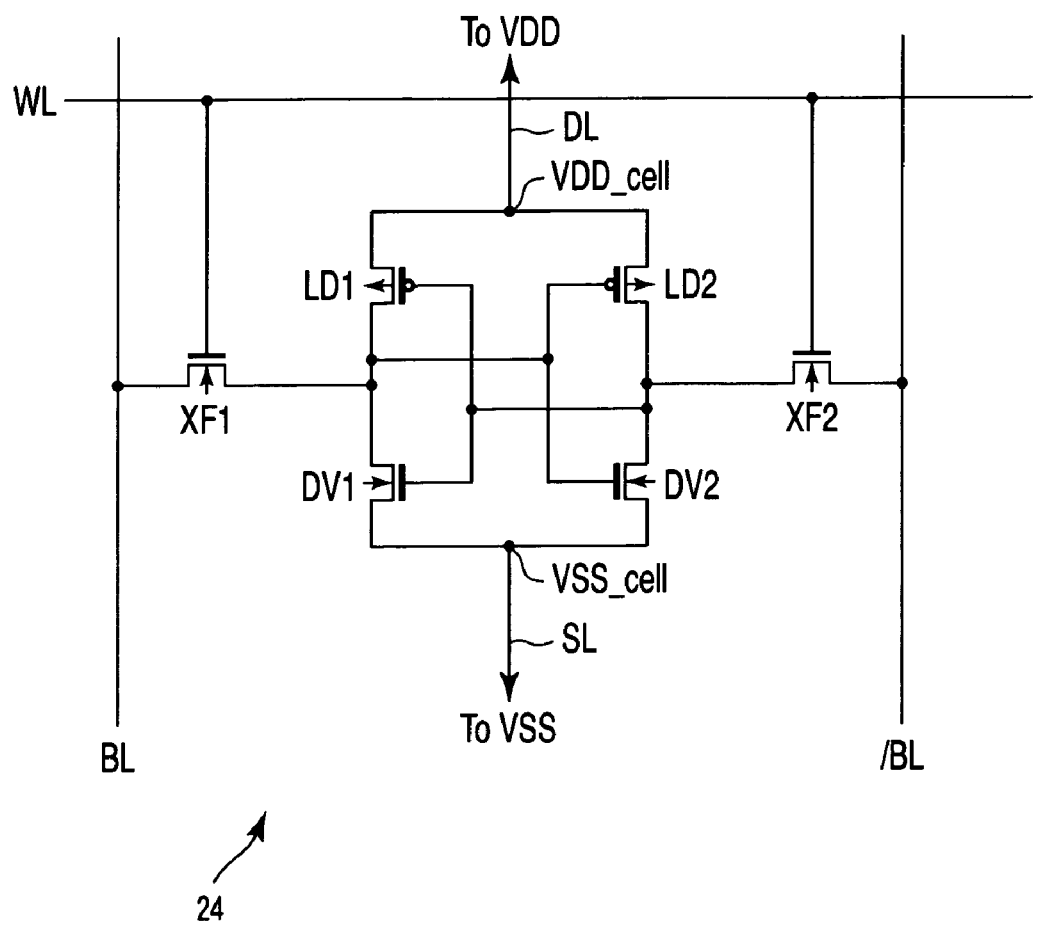
FIG. 4 is an enlarged view showing one memory cell in the memory cell array shown in FIG. 3.

FIG. 4 is an enlarged view showing one memory cell 24 in the memory cell array 21 shown in FIG. 3. As shown in FIG. 4, each memory cell includes six transistors, i.e., two driver transistors DV1 and DV2, two load transistors LD1 and LD2, and two transfer gate transistors XF1 and XF2. The transistors DV1, DV2, XF1, and XF2 are formed of NMIS- (MIS: Metal-Insulator-Semiconductor) FETs, and typically formed of NMOSFETs. The transistors LD1 and LD2 are formed of PMISFETs, and typically formed of PMOSFETs. The two transistors in each of the pair of transistors DV1 and DV2, the pair of transistors XF1 and XF2, and the pair of transistors LD1 and LD2 are designed to have the same specifications as each other (size, layout pattern, and so forth) and the same threshold voltage as each other (formed in the same process steps).

The driver transistors DV1 and DV2 and load transistors LD1 and LD2 are connected to form a cross-feedback circuit. Specifically, the drain terminals of the transistors DV1 and LD1 are connected to each other. The drain terminals of the transistors DV2 and LD2 are connected to each other. The gate terminals of the transistors DV1 and LD1 are connected to the drain terminals of the transistors DV2 and LD2 and the source terminal of the transfer gate transistor XF2. The gate terminals of the transistors DV2 and LD2 are connected to the drain terminals of the transistors DV1 and LD1 and the source terminal of the transfer gate transistor XF1.

Each of the word lines WL is connected to the gate terminals of the transistors XF1 and XF2. Each of the complementary pairs of data lines BL and /BL are respectively connected to the drain terminals of the transistors XF1 and XF2. The source terminals of the transistors LD1 and LD2 are connected to a supply source of a power supply potential (a first drive potential) VDD through a potential line DL. The source terminals of the transistors DV1 and DV2 are connected to a supply source of a ground potential (a second drive potential lower than the first drive potential) VSS through a potential line SL.

Figure 5:
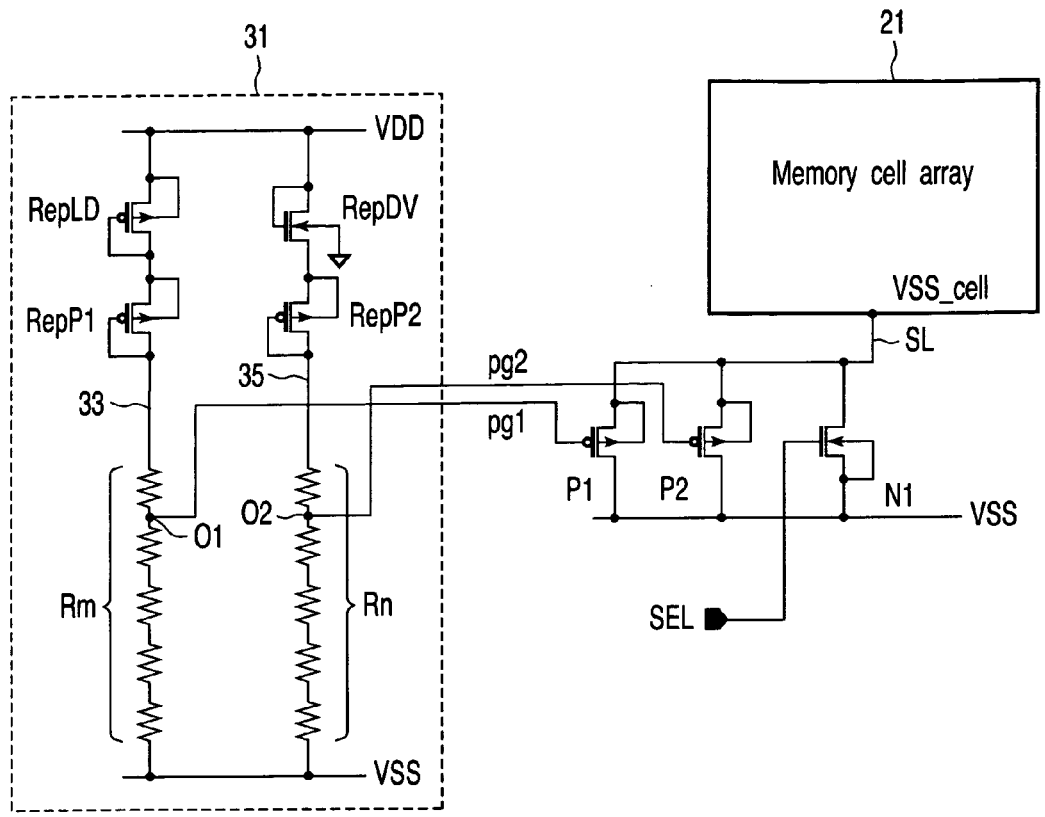
FIG. 5 is a view showing the SRAM (semiconductor storage device) according to the first embodiment, focusing on circuitry for clamping the standby voltage thereof.

FIG. 5 is a view showing the SRAM (semiconductor storage device) according to the first embodiment, focusing on circuitry for clamping the standby voltage thereof. AS shown in FIG. 5, the potential line SL connected to the ground potential VSS is provided with a first additional transistor N1 disposed thereon for selectively bringing the potential line SL into conduction. The transistor N1 is formed of an NMISFET, and typically an NMOSFET. The gate terminal of the transistor N1 is supplied, through a supply line L1 (for example, from the control section CS1), with a selection signal SEL to set the transistor N1 in the ON-state when the memory cell is selected. Specifically, the transistor N1 is set in the ON-state when the memory cell is selected, and it is set in the OFF-state when the memory cell is non-selected. When the memory cell is selected, the ground potential VSS is applied to the node on the lower potential VSS_cell side, through the transistor N1 set in the ON-state.

The potential line SL is also provided with second and third additional transistors P1 and P2 disposed thereon for selectively bringing the potential line SL into conduction, such that the transistors P1 and P2 are in parallel with the first additional transistor N1. The transistors P1 and P2 are formed of PMISFETs, and typically PMOSFETs. The gate terminals of the transistors P1 and P2 are always supplied with potentials pg1 and pg2, respectively, generated in a bias generator 31. The transistors P1 and P2 are turned on, with reference to the bias potentials pg1 and pg2, by a voltage drop generated in the corresponding memory cell when the transistor N1 is set in the OFF-state. As described later, only one of the transistors P1 and P2 serves to clamp the voltage (standby voltage VSB) applied to the memory cell on standby.

The bias generator 31 is arranged such that the bias potentials pg1 and pg2 reflect fluctuations in the potential difference between the power supply potential (first drive potential) VDD and ground potential (second drive potential) VSS, and variations (mainly process errors) in the threshold voltage Vth of transistors. In order to carry this out, the bias generator 31 includes two paths (i.e. two bias generation circuits) 33 and 35, each of which is supplied with the power supply potential VDD and ground potential VSS at opposite ends, and provided with predetermined devices disposed thereon, as described below. The bias potentials pg1 and pg2 are potentials between the power supply potential VDD and ground potential VSS, and are respectively outputted from output nodes O1 and O2 variably set in position on the two paths 33 and 35.

More specifically, the first path 33 is provided with transistors RepLD and RepP1 and a plurality of resistors Rm disposed thereon in series, in this order from the end supplied with the power supply potential VDD. The second path 35 is provided with transistors RepDV and RepP2 and a plurality of resistors Rn disposed thereon in series, in this order from the end supplied with the power supply potential VDD. The transistors RepLD, RepP1, and RepP2 are formed of PMISFETs, and typically PMOSFETs. The transistor RepDV is formed of an NMISFET, and typically an NMOSFET. Each of the transistors RepLD, RepP1, RepDV, and RepP2 is disposed on the paths 33 and 35 in a diode-connection state in which its gate terminal and drain terminal are connected to each other.

The transistors RepLD and RepDV are respectively formed of replica transistors of the load transistor (LD1 or LD2) and drive transistor (DV1 or DV2), which constitute the cross-feedback circuit of the memory cell. The transistors RepP1 and RepP2 are respectively formed of replica transistors of the additional transistors P1 and P2 disposed on the potential line SL. Specifically, the transistors RepLD, RepP1, RepDV, and RepP2 are designed to have the same specifications (size, layout pattern, and so forth) and the same threshold voltage as the transistors LD1 (or LD2), P1, DV1 (or DV2), and P2, respectively, (formed in the same process steps).

Figure 6:
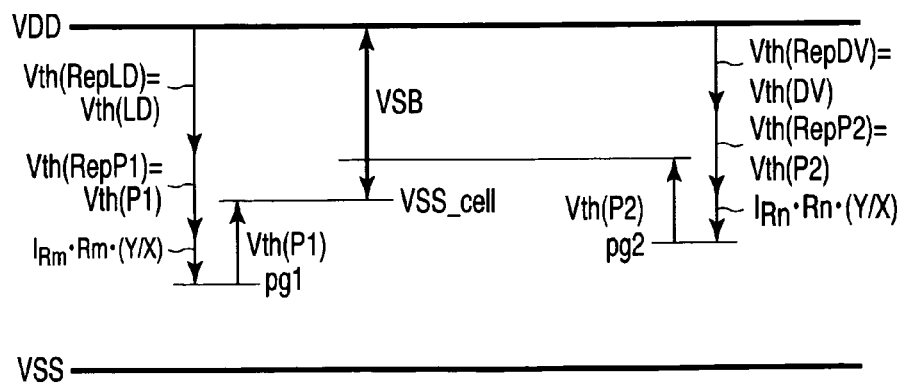
FIG. 6 is a view showing the potential relationship within a memory cell on standby in the device shown in FIG. 5.

FIG. 6 is a view showing the potential relationship within a memory cell on standby in the device shown in FIG. 5. When the memory cell is selected, the ground potential VSS is applied to the node on the lower potential VSS_cell side, through the transistor N1 set in the ON-state. On the other hand, when the memory cell is non-selected and the transistor N1 is set in the OFF-state, the potential level at the node on the lower potential VSS_cell side gradually increases from the VSS due to leakage. When the lower potential VSS_cell increases and exceeds one of the threshold voltages of the transistors P1 and P2 present at the lower level, this transistor P1 or P2 is turned on. As a consequence, the voltage (standby voltage VSB) applied to the memory cell on standby is clamped by this turned-on transistor P1 or P2.

Since bias potential setting on the two paths 33 and 35 are based on essentially the same principle, an explanation will be first given of the first path 33. Specifically, as described above, the replica transistor RepLD configured in a diode-connection state has the same threshold voltage as the load transistor (LD1 or LD2), (i.e., Vth(RepLD)=Vth(LD)). The replica transistor RepP1 configured in a diode-connection state has the same threshold voltage as the additional transistor P1, (i.e., Vth(RepP1)=Vth(P1)). Furthermore, a predetermined number (Y) of resistors selected from the total number (X) of resistors Rm are interposed between the transistor RepP1 and output node O1.

In this case, the difference between the power supply potential VDD and the potential at the output node O1 becomes a value corresponding to the sum of the threshold voltages Vth(LD) and Vth(P1) plus a margin ($I_{Rm} \times Rm \times (Y/X)$) obtained by resistance division. The $I_{Rm}$ denotes a current flowing through the resistors Rm. Accordingly, the bias potential pg1 generated by the first path 33 is expressed by the following formula (3).

$$pg1 = VDD - Vth(LD) - Vth(P1) - I_{Rm} \times Rm \times (Y/X) \quad (3)$$

In this formula, the Vth(LD), Vth(P1), and "$I_{rm} \times Rm \times (Y/X)$" denote the threshold voltage of the transistor LD1 (or LD2), the threshold voltage of the transistor P1, and the margin obtained by resistance division, respectively.

The transistor P1 supplied with the bias potential pg1 on the gate terminal is turned on when the lower potential VSS_cell of the memory cell comes to satisfy the following formula (4).

$$VSS\_cell - pg1 > Vth(P1) \quad (4)$$

As a consequence, where the first path 33 is effective, the level of the lower potential VSS_cell is clamped by the bias potential pg1 and threshold voltage Vth(P1), as shown in the following formula (5).

$$VSS\_cell = pg1 + Vth(P1) \quad (5)$$
$$= VDD - Vth(LD) - Vth(P1) - I_{Rm} \times Rm \times (Y/X) + Vth(P1)$$

Accordingly, where the first path 33 is effective, the voltage (standby voltage VSB) applied to the memory cell on standby is clamped by a value expressed by the following formula (6).

$$VSB = VDD - VSS\_cell \quad (6)$$
$$= Vth(LD) + I_{Rm} \times Rm \times (Y/X)$$

Similarly, where the second path 35 is effective, the level of the lower potential VSS_cell is clamped by the bias potential pg2 and threshold voltage Vth(P2), as shown in the following formula (7).

$$VSS\_cell = pg2 + Vth(P2) \quad (7)$$
$$= VDD - Vth(DV) - Vth(P2) - I_{Rn} \times Rn \times (Y/X) + Vth(P2)$$

In this formula, the Vth(DV), Vth(P2), and "$I_{rn} \times Rn \times (Y/X)$" denote the threshold voltage of the transistor DV1 (or DV2), the threshold voltage of the transistor P2, and the margin obtained by resistance division, respectively.

Accordingly, where the second path 35 is effective, the voltage (standby voltage VSB) applied to the memory cell on standby is clamped by a value expressed by the following formula (8).

$$VSB = VDD - VSS\_cell \quad (8)$$
$$= Vth(DV) + I_{Rn} \times Rn \times (Y/X)$$

However, actually, the level of the lower potential VSS_cell is clamped by one of the transistors P1 and P2, which is turned on at the lower level. Accordingly, the voltage (standby voltage VSB) applied to the memory cell on standby is clamped by a value expressed by the following formula (9).

$$VSB = \max(\text{``}Vth(LD)+I_{Rm} \times Rm \times (Y/X)\text{''}: \text{``}Vth(DV)+I_{Rn} \times Rn \times (Y/X)\text{''}) \quad (9)$$

In this formula, the max(A:B) denotes that only the higher one of A and B is effective.

Typically, the margins "$I_{Rm} \times Rm \times (Y/X)$" and "$I_{Rn} \times Rn \times (Y/X)$" obtained by resistance division are set to be the same value. In this case, which one of the transistors P1 and P2 is effective to clamp the standby voltage VSB is determined by the magnitude relationship between the threshold voltages Vth(LD) and Vth(DV).

The bias potentials pg1 and pg2 are set such that one of the transistors P1 and P2 can be turned on before increase in the level of the lower potential VSS_cell (i.e. voltage drop in the memory cell) proceeds to a degree at which the data stored in the corresponding memory cell is destroyed. In order to retain the data stored in an SRAM memory cell on standby (WL=L), it is necessary to maintain one of the load transistors LD1 (or LD2) and the other of the driver transistors DV2 (or DV1) in the ON-state. Accordingly, the bias potentials pg1 and pg2 are preferably set such that, before either one of the transistors LD1 (or LD2) and DV2 (or DV1) is turned off due to the voltage drop, one of the transistors P1 and P2 is turned on to stop the voltage drop. In addition, even among memory cells forming the same array, there may be a difference in the threshold voltage due to process errors. Accordingly, the margin ("$I_{Rm} \times Rm \times (Y/X)$" or "$I_{Rn} \times Rn \times (Y/X)$") obtained by resistance division can be set, in consideration of variations in the threshold voltage of the transistors LD1, LD2, DV1, and DV2.

As described above, in the device shown in FIG. 5, the bias generator 31 is arranged such that the bias potentials pg1 and pg2 reflect fluctuations in the potential difference between the power supply potential (first drive potential) VDD and ground potential (second drive potential) VSS, and variations (mainly process errors) in the threshold voltage Vth of transistors. Accordingly, even if fluctuations in the VDD and variations in the threshold voltage Vth occur, the VSS_cell can adapt to allow for them, whereby the standby voltage applied to the memory cell always takes on a proper value. In this case, since there is no need to ensure a sufficient margin on the protection circuit, unlike the conventional technique, it is possible to effectively relax the standby voltage, thereby further reducing the standby leakage.

In the arrangement shown in FIG. 5, the bias generator 31 includes the two paths (i.e. two bias generation circuits) 33 and 35 respectively for the load transistors LD1 and LD2 and the driver transistors DV1 and DV2. This arrangement is adopted on the assumption that the magnitude relationship between the threshold voltages Vth of the load transistors LD1 and LD2 and the driver transistors DV1 and DV2 is not known in advance. However, if the magnitude relationship between the threshold voltages Vth is known in advance, it suffices that only one of the paths is disposed for one of the transistors having the highest threshold voltage Vth.

Second Embodiment

Figure 7:
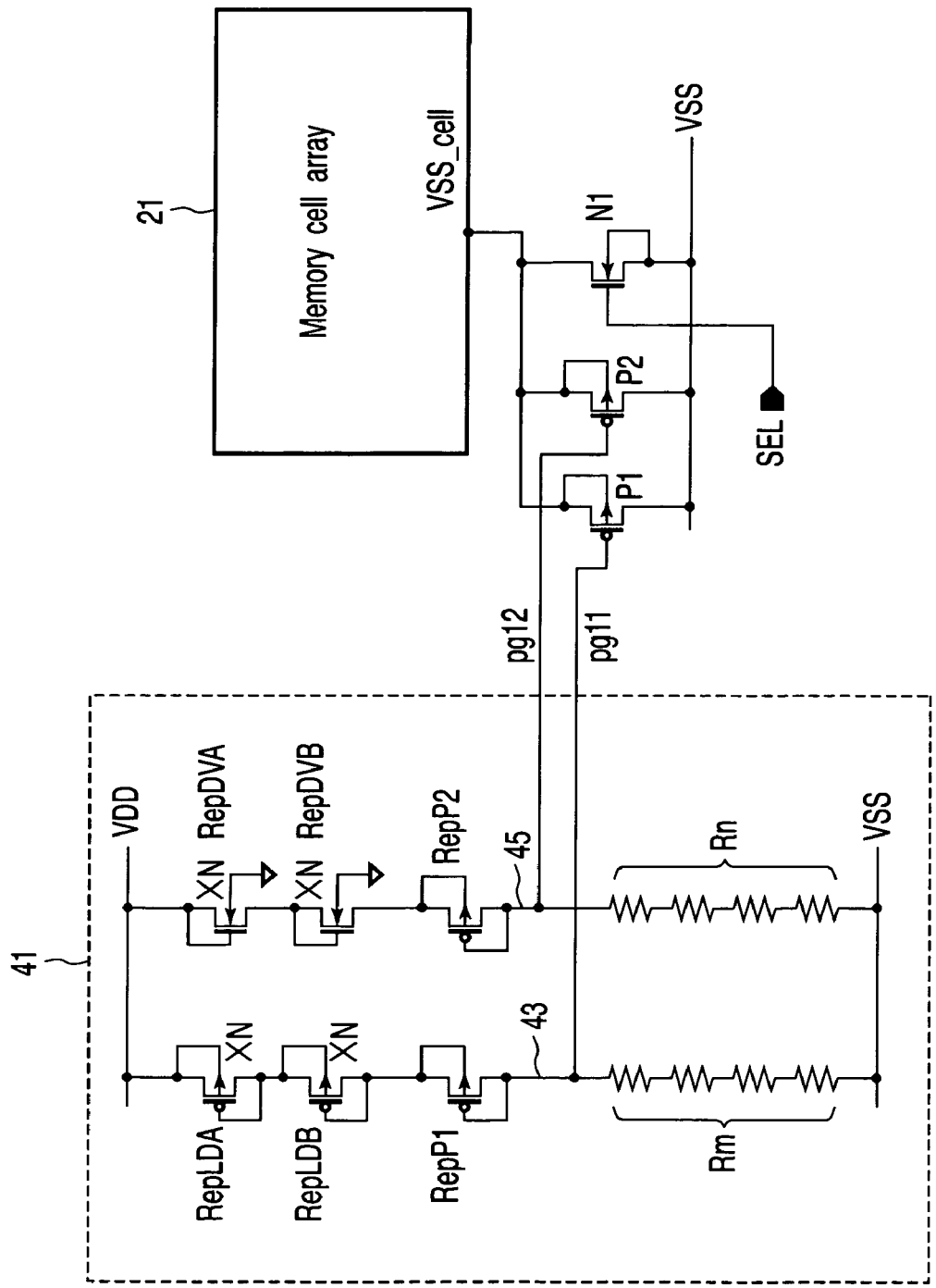
FIG. 7 is a view showing an SRAM (semiconductor storage device) according to a second embodiment of the present invention, focusing on circuitry for clamping the standby voltage thereof.

FIG. 7 is a view showing an SRAM (semiconductor storage device) according to a second embodiment of the present invention, focusing on circuitry for clamping the standby voltage thereof. The SRAM according to the second embodiment has the same structure as the SRAM according to the first embodiment except the bias generator.

As shown in FIG. 7, the bias generator 41 of this SRAM includes two paths (i.e. two bias generation circuits) 43 and 45, each of which is supplied with the power supply potential VDD and ground potential VSS at opposite ends. The first path 43 is provided with a transistor group RepLDA, a transistor group RepLDB, a transistor RepP1, and a plurality of resistors Rm disposed thereon in series, in this order from the end supplied with the power supply potential VDD. The second path 45 is provided with a transistor group RepDVA, a transistor group RepDVB, a transistor RepP2, and a plurality of resistors Rn disposed thereon in series, in this order from the end supplied with the power supply potential VDD. The transistors RepP1 and RepP2 and a plurality of resistors Rm and Rn are essentially the same as those shown in FIG. 5.

The transistor group RepLDA is formed of a number N(N is a natural number of 2 or more) of replica transistors of the load transistor LD1 (or LD2) connected in parallel, wherein each of these replica transistors is configured in a diode-connection state. The transistor group RepLDB is formed of a number N of replica transistors of the load transistor LD2 (or LD1) connected in parallel, wherein each of these replica transistors is configured in a diode-connection state. The transistor group RepDVA is formed of a number N of replica transistors of the drive transistor DV1 (or DV2) connected in parallel, wherein each of these replica transistors is configured in a diode-connection state. The transistor group RepDVB is formed of a number N of replica transistors of the drive transistor DV2 (or DV1) connected in parallel, wherein each of these replica transistors is configured in a diode-connection state.

As described above, a plurality of replica transistors are connected in parallel, whereby the threshold voltage of the transistor group can be less variable. In other words, variations of the threshold voltages of the replica transistors can reduce adverse influences. It should be noted that this arrangement using a plurality of replica transistors connected in parallel is effective even in a case where only one of the transistor groups RepLDA and RepLDB is disposed, and/or only one of the transistor groups RepDVA and RepDVB is disposed.

Each of the paths 43 and 45 is provided with the replica transistors of memory cell transistors, connected in series, whereby each of bias potentials pg11 and pg12 can reflect variations in the threshold voltage Vth of the memory cell transistors. In this case, the two set of replica transistors (RepLDA and RepLDB, or RepDVA and RepDVB) of memory cell transistors, connected in series, take on a potential drop from the power supply potential VDD to each of the bias potentials pg11 and pg12, and the number of resistors Rm and Rn can be thereby reduced (resistance value can be lowered).

It should be noted that this arrangement using a plurality of replica transistors of memory cell transistors, connected in series, is effective even in a case where each of the transistor group RepLDA, RepLDB, RepDVA, and RepDVB is replaced with the corresponding one replica transistor. This modification is structured, such that the first and second paths 33 and 35 shown in FIG. 5 are provided with additional second replica transistors RepLD and RepDV, respectively. In this case, the second replica transistor RepLD is disposed on the first path 33 between the end supplied with the power supply potential VDD and the output node O1, in series with the first replica transistor RepLD. The second replica transistor RepLD is configured in a diode-connection state in which its gate terminal and drain terminal are connected to each other. The second replica transistor RepDV is disposed on the second path 35 between the end supplied with the power supply potential VDD and the output node O2, in series with the first replica transistor RepDV. The second replica transistor RepDV is configured in a diode-connection state in which its gate terminal and drain terminal are connected to each other.

Third Embodiment

Figure 8:
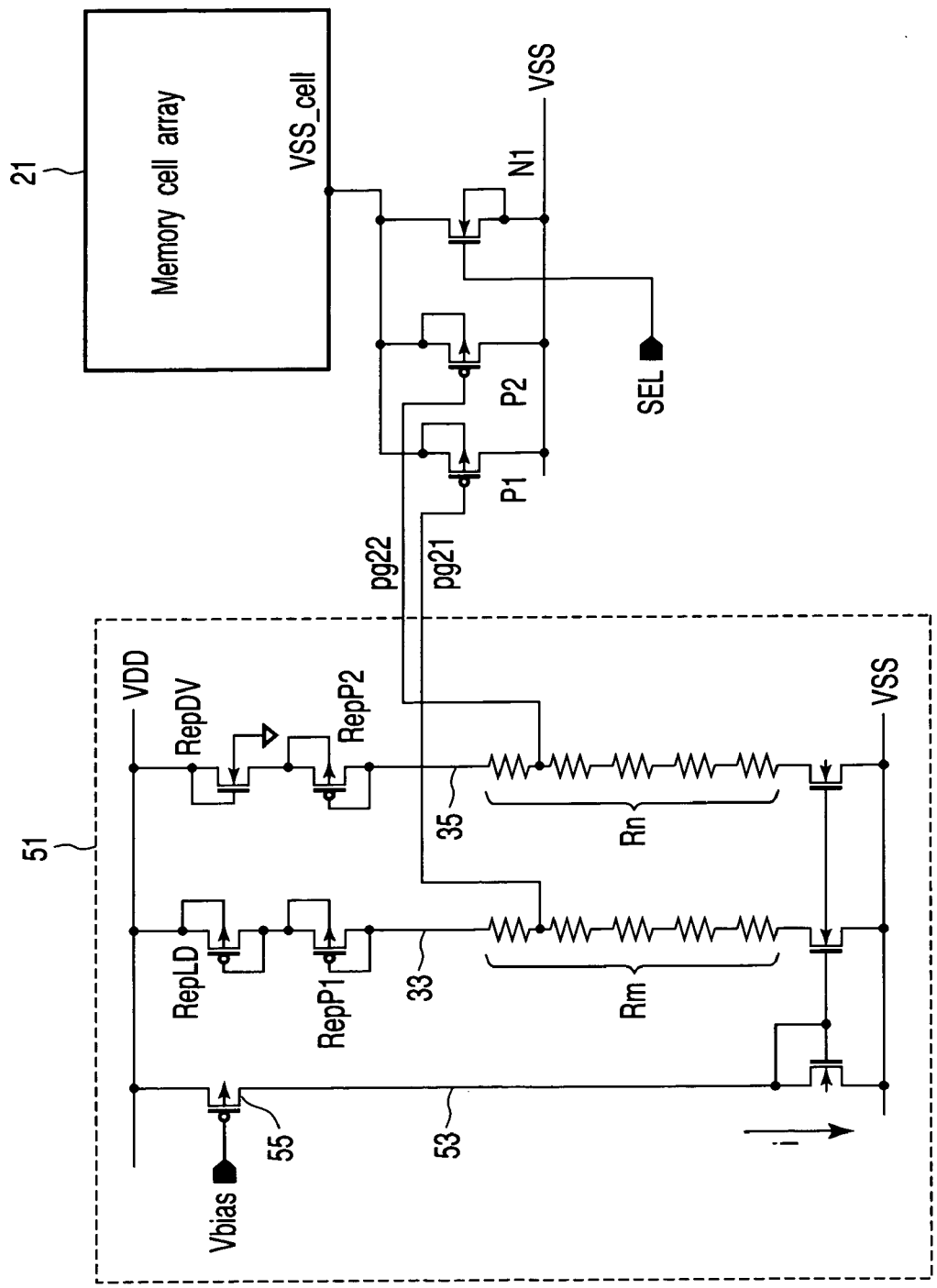
FIG. 8 is a view showing an SRAM (semiconductor storage device) according to a third embodiment of the present invention, focusing on circuitry for clamping the standby voltage thereof.

FIG. 8 is a view showing an SRAM (semiconductor storage device) according to a third embodiment of the present invention, focusing on circuitry for clamping the standby voltage thereof. The SRAM according to the third embodiment has the same structure as the SRAM according to the first embodiment except the bias generator.

As shown in FIG. 8, the bias generator 51 of this SRAM further includes a current mirror circuit 53 to supply a constant current regardless of fluctuations in the power supply potential VDD. The current mirror circuit 53 is connected in parallel with two paths (i.e. two bias generation circuits) 33 and 35. The path of the current mirror circuit 53 is provided with a transistor 55 disposed thereon, whose gate terminal is connected to a constant potential source to avoid any influence caused by fluctuations in the power supply potential VDD. With this arrangement, bias potentials pg21 and pg22 outputted from the bias generator 51 can be more stable.

Fourth Embodiment

Figure 9:
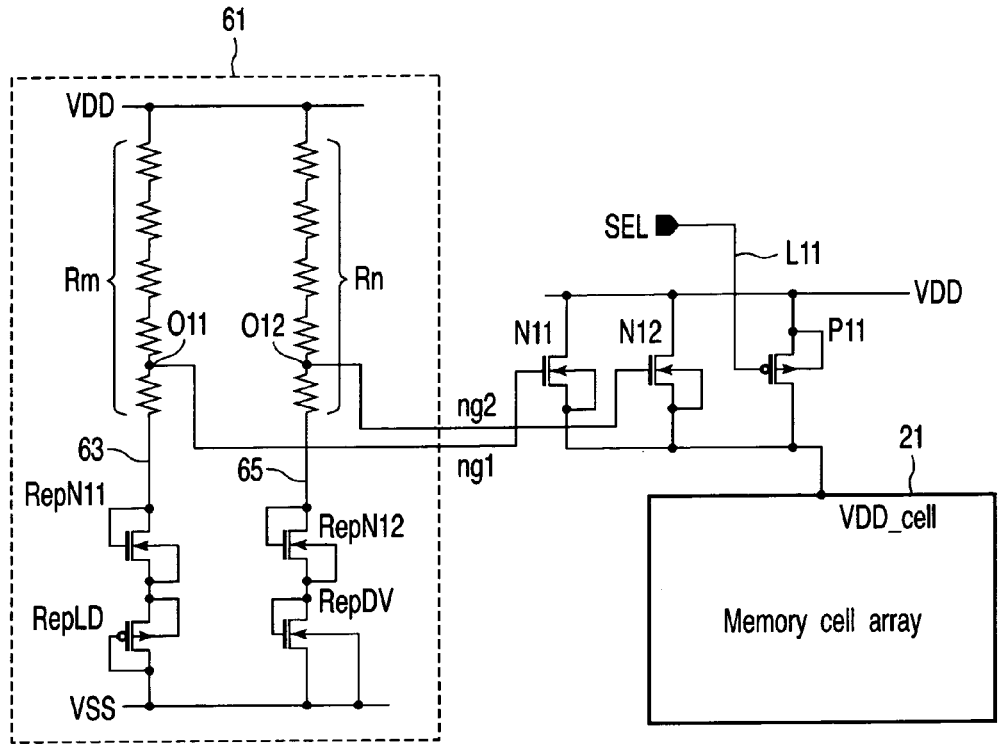
FIG. 9 is a view showing an SRAM (semiconductor storage device) according to a fourth embodiment of the present invention, focusing on circuitry for clamping the standby voltage thereof.

FIG. 9 is a view showing an SRAM (semiconductor storage device) according to a fourth embodiment of the present invention, focusing on circuitry for clamping the standby voltage thereof. In the first to third embodiments, the level of the lower potential VSS_cell of a memory cell is controlled to clamp the standby voltage thereof (i.e., to reduce the standby leakage). However, the level of the higher potential VDD_cell may be controlled in accordance with the same concept. The SRAM shown in FIG. 9 is configured on the basis of such an aspect. The memory cell array 21 and memory cell 24 of this SRAM have the same structures as those shown in FIGS. 3 and 4.

AS shown in FIG. 9, a potential line DL connected to the power supply potential VDD is provided with a first additional transistor P11 disposed thereon for selectively bringing the potential line DL into conduction. The transistor P11 is formed of a PMISFET, and typically a PMOSFET. The gate terminal of the transistor P11 is supplied, through a supply line L11, with a selection signal SEL to set the transistor P11 in the ON-state when the memory cell is selected. Specifically, the transistor P11 is set in the ON-state when the memory cell is selected, and it is set in the OFF-state when the memory cell is non-selected. When the memory cell is selected, the power supply potential VDD is applied to the node on the higher potential VDD_cell side, through the transistor P11 set in the ON-state.

The potential line DL is also provided with second and third additional transistors N11 and N12 disposed thereon for selectively bringing the potential line DL into conduction, such that the transistors N11 and N12 are in parallel with the first additional transistor P11. The transistors N11 and N12 are formed of NMISFETs, and typically NMOSFETs. The gate terminals of the transistors N11 and N12 are always supplied with potentials ng1 and ng2, respectively, generated in a bias generator 61. The transistors N11 and N12 are turned on, with reference to the bias potentials ng1 and ng2, by a voltage drop generated in the corresponding memory cell when the transistor P11 is set in the OFF-state. As described later, only one of the transistors N11 and N12 serves to clamp the voltage (standby voltage VSB) applied to the memory cell on standby.

The bias generator 61 is arranged such that the bias potentials ng1 and ng2 reflect fluctuations in the potential difference between the power supply potential (first drive potential) VDD and ground potential (second drive potential) VSS, and variations (mainly process errors) in the threshold voltage Vth of transistors. In order to carry this out, the bias generator 61 includes two paths (i.e. two bias generation circuits) 63 and 65, each of which is supplied with the power supply potential VDD and ground potential VSS at opposite ends, and provided with predetermined devices disposed thereon, as described below. The bias potentials ng1 and ng2 are potentials between the power supply potential VDD and ground potential VSS, and are respectively outputted from output nodes O11 and O12 variably set in position on the two paths 63 and 65.

More specifically, the first path 63 is provided with transistors RepLD and RepN11 and a plurality of resistors Rm disposed thereon in series, in this order from the end supplied with the ground potential VSS. The second path 65 is provided with transistors RepDV and RepN12 and a plurality of resistors Rn disposed thereon in series, in this order from the end supplied with the ground potential VSS. The transistor RepLD is formed of a PMISFET, and typically a PMOSFET. The transistors RepDV, RepN11, and RepN12 are formed of NMISFETs, and typically NMOSFETs. Each of the transistors RepLD, RepN11, RepDV, and RepN12 is disposed on the paths 63 and 65 in a diode-connection state in which its gate terminal and drain terminal are connected to each other.

The transistors RepLD and RepDV are respectively formed of replica transistors of the load transistor (LD1 or LD2) and drive transistor (DV1 or DV2), which constitute the cross-feedback circuit of the memory cell. The transistors RepN11 and RepN12 are respectively formed of replica transistors of the additional transistors N11 and N12 disposed on the potential line DL. Specifically, the transistors RepLD, RepN11, RepDV, and RepN12 are designed to have the same specifications (size, layout pattern, and so forth) and the same threshold voltage as the transistors LD1 (or LD2), N11, DV1 (or DV2), and N12, respectively, (formed in the same process steps).

Figure 10:
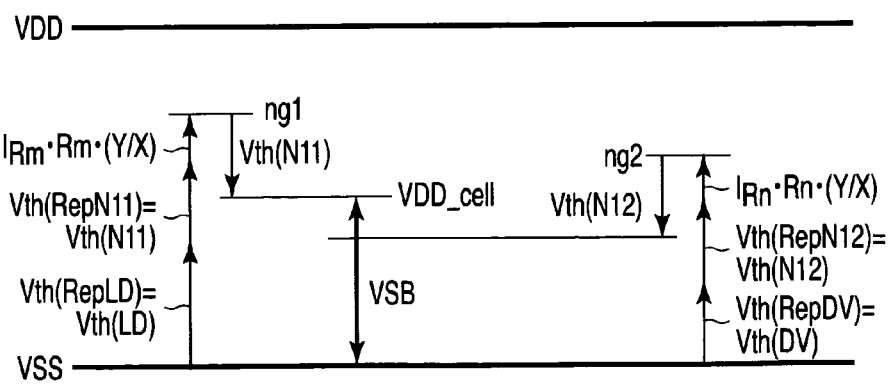
FIG. 10 is a view showing the potential relationship within a memory cell on standby in the device shown in FIG. 9.

FIG. 10 is a view showing the potential relationship within a memory cell on standby in the device shown in FIG. 9. When the memory cell is selected, the power supply potential VDD is applied to the node on the higher potential VDD_cell side, through the transistor P11 set in the ON-state. On the other hand, when the memory cell is non-selected and the transistor P11 is set in the OFF-state, the potential level at the node on the higher potential VDD_cell side gradually decreases from the VDD due to leakage. When the higher potential VDD_cell decreases and becomes lower than one of the threshold voltages of the transistors N11 and N12 present at the higher level, this transistor N11 or N12 is turned on. As a consequence, the voltage (standby voltage VSB) applied to the memory cell on standby is clamped by this turned-on transistor N11 or N12.

Accordingly, the level of the higher potential VDD_cell is clamped by one of the transistors N11 and N12, which is turned on at the higher level. As a consequence, in accordance with development explained along with the formulas (3) to (9), the voltage (standby voltage VSB) applied to the memory cell on standby is clamped by a value expressed by the following formula (10), which is the same as the formula (9).

$$VSB=\max(\text{``}Vth(LD)+I_{Rm}\times Rm\times(Y/X)\text{''}: \quad \text{``}Vth(DV) +I_{Rn}\times Rn\times(Y/X)\text{''}) \quad (10)$$

In this formula, the Vth(LD), "$I_{Rm}\times Rm\times(Y/X)$", Vth(DV), and "$I_{Rn}\times Rn\times(Y/X)$" denote the threshold voltage of the transistor LD1 (or LD2), a margin obtained by resistance division, the threshold voltage of the transistor DV1 (or DV2), and a margin obtained by resistance division, respectively. Also, the max(A:B) denotes that only the higher one of A and B is effective.

The bias potentials ng1 and ng2 are set such that one of the transistors N11 and N12 can be turned on before decrease in the level of the higher potential VDD_cell (i.e. voltage drop in the memory cell) proceeds to a degree at which the data stored in the corresponding memory cell is destroyed. Accordingly, the bias potentials ng1 and ng2 are preferably set such that, before any one of the transistors LD1, LD2, DV1, and DV2 is turned off due to the voltage drop, one of the transistors N11 and N12 is turned on to stop the voltage drop.

(Matters common to the first to fourth embodiments)

In the embodiment described above, each memory cell 24 of the RAM is formed of six transistors, as shown in FIG. 4. However, the ideas included in these embodiments may be similarly applied to an SRAM of another type, such as an SRAM, in which each memory cell is formed of four transistors and two resistors substituting two load transistors. Specifically, an SRAM of another type can be arranged to clamp the voltage applied to a memory cell on standby, while utilizing a bias potential that reflects fluctuations in the potential difference between the drive potentials, and variations in the threshold voltage of the memory cell transistors.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A semiconductor storage device comprising:
a memory cell array including a plurality of SRAM memory cells (SRAM: Static Random Access Memory) arrayed therein;
a plurality of word lines configured to select the memory cells;
a plurality of complementary pairs of data lines configured to transmit data into and from the memory cells;
a first potential line configured to supply a first drive potential to each of the memory cells;
a second potential line configured to supply a second drive potential lower than the first drive potential to each of the memory cells;
a first additional FET (FET: Field-Effect Transistor) disposed on one potential line of the first and second potential lines, to selectively bring the one potential line into conduction;
a selection signal supply line configured to supply a selection signal to a gate terminal of the first additional FET, so as to set the first additional FET in an ON-state, when each of the memory cells is selected;
a second additional FET disposed on the one potential line, in parallel with the first additional FET, to selectively bring the one potential line into conduction; and
a bias generation circuit configured to generate a bias potential and supply the bias potential to a gate terminal of the second additional FET, wherein the bias potential is generated to reflect one or both of fluctuations in a potential difference between the first and second drive potentials, and variations in threshold voltage of FETs included in a cross-feedback circuit of each of the memory cells.

2. The device according to claim 1, wherein the bias potential is a potential different from the first and second drive potentials, and the second additional FET is turned on, with reference to the bias potential, by a voltage drop generated in a corresponding memory cell when the first additional FET is set in an OFF-state.

3. The device according to claim 2, wherein the bias potential is arranged such that the second additional FET is turned on before the voltage drop proceeds to a degree at which data stored in the corresponding memory cell is destroyed.

4. The device according to claim 3, wherein the bias potential is arranged such that, before any one of the FETs included in the cross-feedback circuit of each of the memory cells is turned off due to the voltage drop, the second additional FET is turned on to stop the voltage drop.

5. The device according to claim 1, wherein the one potential line is the second potential line, and the first and second additional FETs are an NMOSFET (MOS: Metal-Oxide-Semiconductor) and a PMOSFET, respectively.

6. The device according to claim 1, wherein the bias generation circuit comprises a path supplied with the first and second drive potentials respectively at opposite ends, and configured to output the bias potential from a predetermined node on the path.

7. The device according to claim 6, wherein the bias generation circuit comprises a first replica FET prepared to have the same specifications and the same threshold voltage as one of the FETs included in the cross-feedback circuit of each of the memory cells, and the first replica FET is disposed on the path in a diode-connection state to have a gate terminal and a drain terminal connected to each other.

8. The device according to claim 7, wherein the bias generation circuit comprises a second replica FET prepared to have the same specifications and the same threshold voltage as the second additional FET, and the second replica FET is disposed on the path in series with the first replica FET and in a diode-connection state to have a gate terminal and a drain terminal connected to each other.

9. The device according to claim 7, wherein the bias generation circuit further comprises a third replica FET being of the same conductivity type as the first replica FET and prepared to have the same specifications and the same threshold voltage as one of the FETs included in the cross-feedback circuit, and the third replica FET is disposed on the path in series with the first replica FET and in a diode-connection state to have a gate terminal and a drain terminal connected to each other.

10. The device according to claim 6, wherein the bias generation circuit further comprises a current mirror circuit connected in parallel with the path and configured to supply a constant current.

11. A semiconductor storage device comprising:
a memory cell array including a plurality of memory cells arrayed therein, each of the memory cells having first to fourth NMISFETs (MIS: Metal-Insulator-Semiconductor) and first and second PMISFETs, such that a drain terminal of the first NMISFET is connected to a drain terminal of the first PMISFET, a drain terminal of the second NMISFET is connected to a drain terminal of the second PMISFET, gate terminals of the first NMISFET and the first PMISFET are connected to the drain terminals of the second NMISFET and the second PMISFET and a source terminal of the third NMISFET, and gate terminals of the second NMISFET and the second PMISFET are connected to the drain terminals of the first NMISFET and the first PMISFET and a source terminal of the fourth NMISFET;
a plurality of word lines configured to select the memory cells, each of the word lines being connected to gate terminals of the third NMISFET and the fourth NMISFET;
a plurality of complementary pairs of data lines configured to transmit data into and from the memory cells, the data lines of each of the complementary pairs being connected to drain terminals of the third NMISFET and the fourth NMISFET, respectively;
a first potential line connecting source terminals of the first PMISFET and the second PMISFET to a supply source of a first drive potential;
a second potential line connecting source terminals of the first NMISFET and the second NMISFET to a supply source of a second drive potential lower than the first drive potential;
a fifth NMISFET disposed on the second potential line to selectively bring the second potential line into conduction;
a selection signal supply line configured to supply a selection signal to a gate terminal of the fifth NMISFET, so as to set the fifth NMISFET in an ON-state, when each of the memory cells is selected;
a third PMISFET disposed on the second potential line, in parallel with the fifth NMISFET, to selectively bring the second potential line into conduction; and
a first bias generation circuit configured to generate a first bias potential and supply the first bias potential to a gate terminal of the third PMISFET, the first bias generation circuit comprising a first path supplied with the first and second drive potentials respectively at opposite ends, and configured to output the first bias potential from a first node on the first path.

12. The device according to claim 11, wherein the first bias potential is a potential different from the first and second drive potentials, and the third PMISFET is turned on, with reference to the first bias potential, by a voltage drop generated in a corresponding memory cell when the fifth NMISFET is set in an OFF-state, and wherein the first potential is arranged such that, before any one of the first and second PMISFETs and the first and second NMISFETs is turned off due to the voltage drop, the third PMISFET is turned on to stop the voltage drop.

13. The device according to claim 11, wherein the first bias generation circuit comprises a first replica PMISFET prepared to have the same specifications and the same threshold voltage as one of the first and second PMISFETs, and the first replica PMISFET is disposed on the first path between one of the opposite ends supplied with the first drive potential and the first node and in a diode-connection state to have a gate terminal and a drain terminal connected to each other.

14. The device according to claim 13, wherein the first bias generation circuit comprises a second replica PMISFET prepared to have the same specifications and the same threshold voltage as the third PMISFET, and the second replica PMISFET is disposed on the first path in series with the first replica PMISFET, between one of the opposite ends supplied with the first drive potential and the first node, and in a diode-connection state to have a gate terminal and a drain terminal connected to each other.

15. The device according to claim 13, wherein the first bias generation circuit comprises a third replica PMISFET prepared to have the same specifications and the same threshold voltage as one of the first and second PMISFETs, and the third replica PMISFET is disposed on the first path in series with the first replica PMISFET, between one of the opposite ends supplied with the first drive potential and the first node, and in a diode-connection state to have a gate terminal and a drain terminal connected to each other.

16. The device according to claim 13, further comprising:
a fourth PMISFET disposed on the second potential line, in parallel with the fifth NMISFET and the third PMISFET, to selectively bring the second potential line into conduction; and
a second bias generation circuit configured to generate a second bias potential and supply the second bias potential to a gate terminal of the fourth PMISFET, the second bias generation circuit comprising a second path supplied with the first and second drive potentials respectively at opposite ends, and configured to output the second bias potential from a second node on the second path,
wherein the second bias generation circuit comprises a first replica NMISFET prepared to have the same specifications and the same threshold voltage as one of the first and second NMISFETs, and the first replica NMISFET is disposed on the second path between one of the opposite ends supplied with the first drive potential and the second node and in a diode-connection state to have a gate terminal and a drain terminal connected to each other.

17. The device according to claim 11, wherein the first bias generation circuit comprises a first replica NMISFET prepared to have the same specifications and the same threshold voltage as one of the first and second NMISFETs, and the first replica NMISFET is disposed on the first path between one of the opposite ends supplied with the first drive potential and the first node and in a diode-connection state to have a gate terminal and a drain terminal connected to each other.

18. The device according to claim 17, wherein the first bias generation circuit comprises a second replica PMISFET prepared to have the same specifications and the same threshold voltage as the third PMISFET, and the second replica PMISFET is disposed on the first path in series with the first replica NMISFET, between one of the opposite ends supplied with the first drive potential and the first node, and in a diode-connection state to have a gate terminal and a drain terminal connected to each other.

19. The device according to claim 17, wherein the first bias generation circuit comprises a third replica NMISFET prepared to have the same specifications and the same threshold voltage as one of the first and second NMISFETs, and the third replica NMISFET is disposed on the first path in series with the first replica NMISFET, between one of the opposite ends supplied with the first drive potential and the first node, and in a diode-connection state to have a gate terminal and a drain terminal connected to each other.

20. The device according to claim 11, wherein the first bias generation circuit further comprises a current mirror circuit connected in parallel with the first path and configured to supply a constant current.

21. A semiconductor storage device comprising:
a memory cell array including a plurality of memory cells arrayed therein, each of the memory cells having first to fourth NMISFETs and first and second PMISFETs, such that a drain terminal of the first NMISFET is connected to a drain terminal of the first PMISFET, a drain terminal of the second NMISFET is connected to a drain terminal of the second PMISFET, gate terminals of the first NMISFET and the first PMISFET are connected to the drain terminals of the second NMISFET and the second PMISFET and a source terminal of the third NMISFET, and gate terminals of the second NMISFET and the second PMISFET are connected to the drain terminals of the first NMISFET and the first PMISFET and a source terminal of the fourth NMISFET;
a plurality of word lines configured to select the memory cells, each of the word lines being connected to gate terminals of the third NMISFET and the fourth NMISFET;
a plurality of complementary pairs of data lines configured to transmit data into and from the memory cells, the data lines of each of the complementary pairs being connected to drain terminals of the third NMISFET and the fourth NMISFET, respectively;
a first potential line connecting source terminals of the first PMISFET and the second PMISFET to a supply source of a first drive potential;
a second potential line connecting source terminals of the first NMISFET and the second NMISFET to a supply source of a second drive potential lower than the first drive potential;
a third PMISFET disposed on the first potential line to selectively bring the first potential line into conduction;
a selection signal supply line configured to supply a selection signal to a gate terminal of the third PMISFET, so as to set the third PMISFET in an ON-state, when each of the memory cells is selected;

a fifth NMISFET disposed on the first potential line, in parallel with the third PMISFET, to selectively bring the first potential line into conduction; and a first bias generation circuit configured to generate a first bias potential and supply the first bias potential to a gate terminal of the fifth NMISFET, the first bias generation circuit comprising a first path supplied with the first and second drive potentials respectively at opposite ends, and configured to output the first bias potential from a first node on the first path.

22. The device according to claim 21, wherein the first bias potential is a potential different from the first and second drive potentials, and the fifth NMISFET is turned on, with reference to the first bias potential, by a voltage drop generated in a corresponding memory cell when the third PMISFET is set in an OFF-state, and wherein the first potential is arranged such that, before any one of the first and second PMISFETs and the first and second NMISFETs is turned off due to the voltage drop, the fifth NMISFET is turned on to stop the voltage drop.

23. The device according to claim 21, wherein the first bias generation circuit comprises a first replica NMISFET prepared to have the same specifications and the same threshold voltage as one of the first and second NMISFETs, and the first replica NMISFET is disposed on the first path between one of the opposite ends supplied with the second drive potential and the first node and in a diode-connection state to have a gate terminal and a drain terminal connected to each other.

24. The device according to claim 21, wherein the first bias generation circuit comprises a first replica PMISFET prepared to have the same specifications and the same threshold voltage as one of the first and second PMISFETs, and the first replica PMISFET is disposed on the first path between one of the opposite ends supplied with the second drive potential and the first node and in a diode-section state to have a gate terminal and a drain terminal connected to each other.

* * * * *